April 25, 1961 A. R. GOBAT 2,981,849

SEMICONDUCTOR DIODE

Filed Jan. 9, 1956

INVENTOR
ANDRE R. GOBAT
BY Henry Kolin
AGENT

United States Patent Office 2,981,849

Patented Apr. 25, 1961

2,981,849

SEMICONDUCTOR DIODE

Andre R. Gobat, North Caldwell, N.J., assignor to International Telephone and Telegraph Corporation, Nutley, N.J., a corporation of Maryland Filed Jan. 9, 1956, Ser. No. 558,133

4 Claims. (Cl. 307—88.5)

This invention relates to semiconductor diode devices and more particularly to a junction semiconductor diode device having a negative-resistance region particularly adaptable for switching purposes.

Electronic switching has become of increasing importance particularly with the availability of semiconductor devices such as the transistor. This has made possible the construction of compact units suitable for use with computers and in electrical communication. However, there are many fields of application in the electrical communication industry, such as for example in crossbar switching in telephony, where electronic switching systems, in order to be competitive with existing mechanical commutator devices, must be of low cost and of a high degree of reliability. While several devices are known, such as gas-tube diodes and point-contact diodes, these are unsatisfactory for use as electronic switching devices, either on a cost basis or on a reliability or power basis.

For a diode to be suitable for switching applications, it should desirably possess two stable states, for example, one of high resistivity and one of low resistivity. Furthermore, it should be possible by relatively simple means, such as for example the application of a voltage pulse, to drive the diode at will into either of these two stable states. While gas-filled diodes are available for switching purposes, they require relatively large switching voltages and have a relatively slow switching response. Known point-contact semiconductor diodes which have a negative-resistance characteristic may be used for switching purposes, but these devices lack uniformity, do not show desirable stability and, hence, are unreliable for continuous switching operation and are generally limited to the handling of only small power of the order of microwatts.

It is an object of the present invention to provide a novel semiconductor junction diode.

It is a further object to provide a junction diode which has a current-voltage characteristic particularly suitable for switching purposes.

It is a feature of this invention that a semiconducting body having an NPNP structure is provided as a switching diode.

It is a more specific feature of this NPNP diode that the intermediate PN zones of this semiconducting body have a width that is substantially less than the diffusion length for minority carriers within this semiconductive material.

Figure 1:
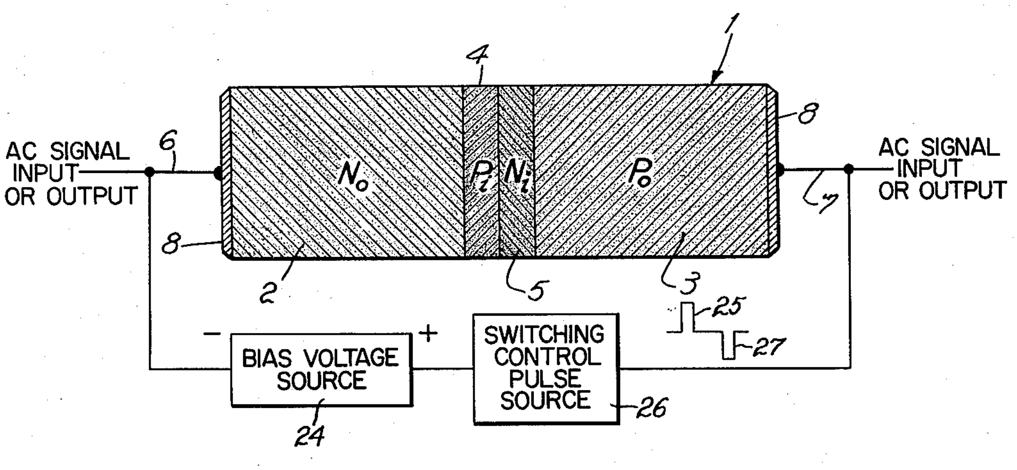
Figure 2:
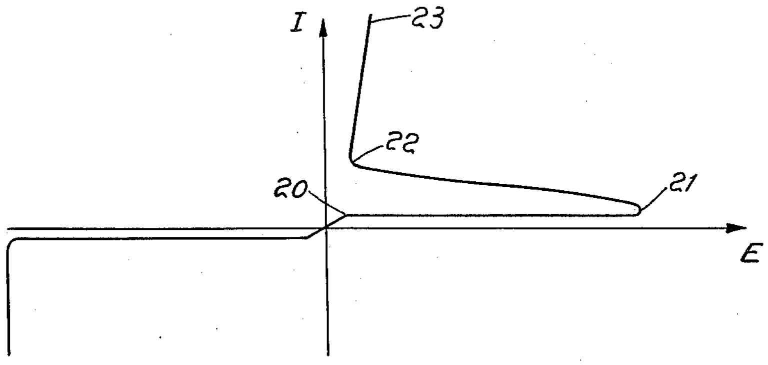

Other objects and features of this invention will appear more fully and clearly from the following description of illustrative embodiments thereof taken in connection with the appended drawings, in which:

Fig. 1 shows in section one embodiment of an NPNP junction switching diode of this invention; and Fig. 2 shows a graphical representation of the current-voltage characteristics of the semiconductor switching diode of this invention.

Referring to Fig. 1, a semiconductor device 1 is shown having four zones or regions therein. The semiconductive material may be germanium, silicon, aluminum antimonide, or the like. As illustrated, the outer or end zones 2 and 3 are of opposite conductivity type, and the intermediate or inner zones 4 and 5 are also of opposite conductivity type. However, in order to provide an NPNP type structure, the polarity of the intermediate zones is arranged such that within the semiconducting body contiguous faces of all of the zones are of opposite conductivity type. The leads 6 and 7 are attached to the end zones 2 and 3, respectively, by methods well known in this art, such as for example the use of a lead-tin solder 8. It should be noted that each of the intermediate zones 4 and 5 is electrically connected only by the internal contiguity of its opposite faces with the other intermediate zone and an end zone. It is furthermore important for the most effective realization of this invention that the width of the intermediate zones be substantially less than the diffusion length for minority carriers within the body of semiconductive material. While the volume resistivity of each of the four zones is preferably substantially the same or differing but slightly, by less than a factor of 1 or 2, the crystal is grown in such a manner that the resistivity values of the outer or end zones are equal to, or slightly greater than, the resistivity values of the intermediate zones.

An example of a specific embodiment of this invention is given below. It should be realized, however, that this example is by way of illustration only to demonstrate a method for producing a device of this invention and is not intended to limit this invention except as set forth in the appended claims.

The zone refining of a semiconductive material such as germanium is well known, and a single crystal of germanium may be grown starting with zone-refined multicrystalline germanium having a volume resistivity between 30 and 60 ohm-centimeters. A single crystal may be grown by the well-known Czochralski pulling technique, as illustrated, for example, by the technique described in the copending application of A. R. Gobat, Serial No. 355,651, filed May 18, 1953, and assigned to the assignee of this invention. A germanium single crystal is grown from molten 40 ohm-centimeter zone-refined germanium. During the growing process, antimony is added to the germanium, for example, 20.8 milligrams antimony per 75 grams germanium to give a 0.1 ohm-centimeter n-type material. Other donor impurities may, of course, also be added, such as arsenic, to produce this type of "doping," as is well known in this art. A 1-centimeter length of n-type germanium is grown over a 25-minute period at an elevated temperature between approximately 930 and 950° C. Then rapidly, within approximately the next minute, three additional junctions are made. Thus, after the 1-centimeter length of n-type germanium has been produced, 9.1 milligrams of a 9.75 percent solution of gallium in germanium is added to convert the n-type melt to a p-type material having a volume resistivity of approximately 0.1 ohm-centimeter. Growth is continued until a zone between 0.001 and 0.004 inch in width has been grown. Such a zone should preferably be between 2 and 3 mils in thickness (1 mil being defined as 0.001 inch). Growth is continued, and 51.5 milligrams of antimony per 70 grams of melt is added to convert the p-type melt to an n-type melt having a volume resistivity of approximately 0.1 ohm-centimeter. This n-type intermediate region is grown to approximately the same width as the previous p-type intermediate region, i.e., 2 to 3 mils. The n-type melt is then again doped with approximately 9.1 milligrams of a 9.75 percent gallium and germanium solution added to the 70 grams of melt. Growth is then continued for approximately 25 minutes to provide a 1-centimeter wide p region. As described herein, then, two end zones of n- and p-type material of approximately 1 centimeter in width have been provided separated by two intermediate zones of opposite conductivity type and having a width between 2 and 3 mils, which distance is substantially less than the diffusion length for minority carriers within the body of semiconductive material. It will, of course, be understood that minority carriers within a p region are electrons and minority carriers within an n region are "holes."

The NPNP germanium bar may be formed into semiconductor diode units in a manner well known in this art. Thus, the semiconductor bar may be sliced along the longitudinal axis of growth into dice having a dimension of 35 by 35 by 175 mils. A conventional 60–40 lead-tin solder may be used for subsequent attachment of leads to the outer regions. An acid flux of the ammonium-zinc chloride type may be used for this purpose. Or, if desired, any other solder suitably doped for the region to be attached to may be used. The bar is then etched electrolytically, the germanium being the anode, and then, after suitable rinsing and drying, attached to a glass header already containing the two terminals of the diode.

It has been found that a diode of the type above described will show current-voltage characteristics approximately as illustrated in Fig. 2. Referring to Fig. 2, it may be seen that, if the voltage across the diode is increased slowly from zero to breakdown with the $N_0$ section negative and the $P_0$ section positive, the current will at first increase rapidly to the saturation value 20 and then remain nearly constant up to the onset of breakdown 21. This is illustrated by the curve 20—21. On further slight increase of voltage, the current will start to rise sharply. If the current is not controlled and permitted to reach a value tolerable to the diode, it will increase to this limiting value. In doing so, the voltage across the diode will quickly decrease at first, curve 21—22, and then slightly increase again, curve 22—23. Inasmuch as the characteristics shown in Fig. 2 reveal that, for any particular voltage between the limits 20 and 21, there are two possible magnitudes for the current, each of which is associated with a stable state of the diode, curve 20—21 or 22—23, it becomes apparent that the device can be used as a switch. All that is needed is to bias the diode with a voltage between 20 and 21, such as from a bias voltage source 24, and, for switching purposes, change the operation from low level to high level or, conversely, from high level to low level. This may be readily achieved by applying a pulse 25 from switching pulse source 26 of voltage larger than 21 across the diode to swing it into high level. High-level operation can then be reverted back to low level by decreasing the operating current to the magnitude of the saturation current or lowered by short circuiting the diode or by applying an opposite polarity pulse 27 from switching pulse source 26 of about equal or greater magnitude to the biasing voltage. Thus, as may be seen from Fig. 2, the resistance or alternating-current impedance across the diode differs considerably for the two stable states. Curve 20—21 represents essentially a high resistance and high alternating-current impedance. Curve 22—23, on the other hand, represents a relatively low resistance or alternating-current impedance. Actual determined values for a specific embodiment showed curve 20—21 to have a resistance of the order of a few megohms and an alternating-current impedance between 50 and 100 megohms; whereas for curve 22—23, experimentally determined values were of the order of 100 ohms. Thus, a diode possessing excellent switching characteristics has been prepared.

The state of development of solid-state physics is such that a theoretical explanation of the phenomenon which has been discovered and described herein can at best be only qualitative, and the operation of the device could, in no ways, be predicted in advance from the existing theoretical knowledge. However, without restricting the invention thereby or limiting the operation of the device to the explanation thereof, an inchoate theoretical derivation to explain the operation of this device follows. Thus, although the resistivity in the various sections is so chosen that all regions are substantially alike, it may be postulated that the resistivity of the end zones or regions will be equal to, or slightly greater than, the resistivity values of the intermediate zones, but never less. As used herein, the terms "slightly greater" or "slightly less" refer to a factor greater than 1 and less than 5. The use of the terms "very much greater" or "very much less" refers to factors in excess of 5. Based on the foregoing assumption, namely, that the two intermediate zones are very slightly lower in resistivity than the adjoining end regions, and based on the further assumption that the width of these inner regions is substantially smaller than the diffusion length for minority carriers, one may apply a potential difference from left to right across the device illustrated in Fig. 1. In such a case, where $N_0$ is made positive and $P_0$ is made negative, very little current will flow across the semiconductor device because both outer junctions ($N_0P_1$ and $N_1P_0$) will be biased in the reverse or blocking direction. The presence of the inner of the three junctions, $P_1N_1$ which will be biased in the forward or conducting direction, will have no effect on the total current passing from $N_0$ to $P_0$. Therefore, provided the applied voltage does not exceed the sum of the breakdown voltages of the junctions $N_0P_1$ and $N_1P_0$, the resulting current should be characteristic of a saturation current and be essentially identical with the saturation current which would result from a diode made of the two outer junctions, viz., $N_0P_0$.

On the other hand, if the direction of the applied potential is reversed (i.e., if $N_0$ is made negative and $P_0$ positive), the two outer junctions ($N_0P_1$ and $N_1P_0$) will be biased in the forward direction and the middle junction ($P_1N_1$) in the reverse direction. Again, it might be expected that very little current would flow, and this current would be essentially identical with the saturation current of the middle junction. However, the close proximity of the two outer junctions has a profound influence on the magnitude of this current.

It is assumed that no generation or recombination of carriers takes place within the two intermediate regions. This approximation may be made since the width of these intermediate zones is small compared with the diffusion lengths of carriers. In this case, and as soon as steady-state conditions are established, the net electron current entering the middle regions from $N_0$ must also pass into $P_0$ across the $N_1P_0$ junction. Conversely, the net hole current crossing the $N_1P_0$ junction from right to left must emerge into $N_0$ across the $N_0P_1$ junction. Inasmuch as the two inner sections are floating, i.e., electrically connected only by the contiguity of adjoining faces, a voltage cannot be directly impressed across $N_0P_1$ or $N_1P_0$. The applied voltage drives electrons from left to right and holes from right to left. However, at the onset, before steady-state conditions are reached, it is possible that quite a few electrons will get trapped in $N_1$ and quite a few holes in $P_1$. This would have the effect of substantially biasing both outer junctions positively, that is, in the forward direction. If this were the case, it is obvious that the net current across the diode would be much larger than the saturation current of a diode comprising only $P_1N_1$.

The conditions required for an appreciable number of carriers to get trapped in $P_1$ or $N_1$ are that $N_0$ be made more strongly n-type than $P_1$ is p-type and $P_0$ more strongly p-type than $N_1$ is n-type. This is clearly not the situation with the switching diode of this invention. Consequently, we must assume that no significant accumulation of excess carriers in $P_1$ or $N_1$ will occur. Therefore, neither $N_0P_1$ nor $N_1P_0$ will be strongly biased in the positive or conducting direction; and the current across the diode will be small and determined, essentially, by a diffusion current as follows:

$$I = aqD_p\left(\frac{p_{N_i}}{W_{P_i}} + b\frac{n_{P_i}}{W_{N_i}}\right)$$

where $I$=current from right to left,
$a$=cross section,
$q$=electronic charge,
$D_p$=diffusion constant for holes,
$p_{N_i}$=hole concentration in $N_i$,
$n_{P_i}$=electron concentration in $P_i$,
$W_{P_i}$=width of $P_i$ section,
$W_{N_i}$=width of $N_i$ section,
$b$=ratio of electron-to-hole mobility.

In other words, the described triple-junction diode should show some sort of saturation current for either polarity of applied voltage. Of course, this saturation current, I, will deviate from a true saturation current because of the effect of space-charge widening of the $P_iN_i$ junction with increasing voltage and its effect on $W_{P_i}$ and $W_{N_i}$. This deviation, however, will have no bearing on the proper operation of the diode.

If the potential across the diode is increased until breakdown at the $P_iN_i$ junction starts to take place, an entirely new situation will present itself. At this point, there will suddenly be an abundance of electrons rushing into $N_i$ and an abundance of holes rushing into $P_i$. As long as $N_oP_i$ and $N_iP_o$ are only weakly biased in the positive direction, these excess carriers cannot diffuse away into $P_o$ and $N_o$ as fast as they are rushing in. Consequently, an appreciable number of them will get trapped in $P_i$ and $N_i$ and thereby effect strong positive biasing of $N_oP_i$ and $N_iP_o$. This, in turn, will increase the electron current from $N_o$ toward $N_i$ and the hole current from $P_o$ toward $P_i$. This additional current will no longer consist primarily of diffusion currents but of drift currents as well. Furthermore, because of the change from low-level to high-level operation with increased current density, the currents in all zones will be influenced strongly by electromotive forces (drift currents). These, therefore, must be considered in analyzing the conditions that will prevail after the onset of breakdown.

The magnitude of the nonstationary, suddenly increasing electron current which will flow from $N_o$ to $N_i$ as a result of positive biasing of the $N_oP_i$ junction will depend on the potential and electron distribution in $N_o$ and in the intermediate zones; the electron current out of $N_i$ into $P_o$ depends on the potential and electron distribution in $P_o$. Similar considerations with appropriate modifications apply to the hole current which will flow from $P_o$ to $P_i$ and from $P_i$ to $N_o$. For convenience, we shall assume perfect symmetry of the diode with respect to the $P_iN_i$ junction as well as equality of electron and hole mobility. The latter assumption is by no means a limitation to the validity of the analysis presented herein inasmuch as an actual inequality in mobilities can be compensated for by appropriate modification of hole-versus-electron concentration, and their gradients in the various zones.

Making the above assumptions, it will be seen that the electron current flowing from $N_o$ to $P_o$ will, in all details, be identical with, although opposite to, the hole current flowing from $P_o$ to $N_o$. Therefore, an analysis of the phenomena taking place on only one side of the $P_iN_i$ junction is sufficient. First, it should be pointed out that, because of symmetry, the hole and electron currents across $P_iN_i$ must be equal in magnitude. Secondly, of importance are the relative magnitudes of electrons and hole currents crossing $N_oP_i$.

Recalling that $N_o$ is slightly less n-type than $P_i$ is p-type and that the ionized impurity concentrations in $N_o$ and $P_i$ are so adjusted as to assure that, at low level, the hole current is virtually larger and, consequently, could never be smaller than the electron current, this may be assumed to be the case also at high level. However, if we take the effect of drift currents at high level into account, we will see that, at least for certain combinations of resistivities in the NPNP structure, the electron current could well be virtually (and, consequently, also actually for very short periods of time) larger than the hole current. An explanation for this possible reversal in the virtual current ratio with the change from low level to high level can be obtained from the following considerations.

At low level, the electron current crossing the $N_oP_i$ junction from left to right is almost entirely determined by the diffusion current of electrons in $P_i$. Similarly, the hole current flowing from right to left is determined by the diffusion current of holes in $N_o$. The effect of small existing potential gradients on the electron current in $P_i$ or the hole current in $N_o$ is negligible because the electron concentration in $P_i$ and the hole concentration in $N_o$ are very small. On the other hand, the potential gradients are always sufficient to assure adequate flow of electrons in $N_o$ and holes in $P_i$ where the respective carriers are in the majority and their concentrations are large.

In switching over from low-level to high-level operation, the large differences between minority- and majority-carrier concentrations become small. In addition, the potential gradients in $N_o$ and $P_i$ as well as the diffusion gradients of the respective minority carriers become large. The diffusion gradients of majority carriers increase too, although to a lesser extent than the minority-carrier diffusion gradients. The situation to the left and right of the $N_oP_i$ junction is now as follows. The potential gradient in $N_o$ will tend to drive electrons from left to right, and the diffusion gradient in $N_o$ will cause a flow of electrons from right to left. The resulting electron current will be the difference between drift and diffusion currents and be directed from left to right. To the right of the $N_oP_i$ junction in $P_i$, both potential gradient and diffusion gradient will drive electrons from left to right. The resulting electron current will be the sum of the drift and electron currents, again flowing from left to right. If the drift and diffusion currents in $N_o$ and $P_i$ are not too different, then it is obvious that the current in $N_o$ would virtually be smaller than the current in $P_i$. However, actually, not considering generation or recombination of carriers, the electron current in $P_i$ cannot exceed the electron current in $N_o$. Consequently, the conditions to the left of the $N_oP_i$ junction will determine the rate of flow of electrons across this junction.

Similar considerations applied to the hole current across the $N_oP_i$ junction from right to left lead to the conclusion that the conditions to the right of the $N_oP_i$ junction will determine the rate of flow of holes across this junction.

From the foregoing, it is evident that the conditions which determine the rate of flow of carriers of either polarity across the $N_oP_i$ junction are not the same for low level as for high level. While at low level the rate-determining process is the diffusion of carriers away from the junction (diffusion of electrons in $P_i$ or of holes in $N_o$), at high level the current is determined by the flow of carriers toward the junction, i.e., drift of electrons in $N_o$ (or holes in $P_i$) toward minus diffusion of electrons in $N_o$ (or holes in $P_i$) away from the junction. The NPNP switching diode is so constructed as to assure that the diffusion gradient for minority carriers in $N_o$ is somewhat larger than in $P_i$ (and also larger in $P_o$ than in $N_i$). This will assure that, at low level, the device will offer a stable high resistance to the flow of current for any voltage below a critical value. Any small increase in current will have little effect on the relative biases of the end junctions, since a small increase in the number of carriers which flow into $P_i$, for instance, will be accompanied by a virtually larger increase of carriers out of $P_1$. Hence, the $N_0P_1$ junction will tend to remain biased only slightly in the forward direction.

Above a certain critical value of voltage, which may be a Zener breakdown voltage or some prebreakdown condition of the $P_1N_1$ junction, the current across the diode will start to rise sharply. As this will alter the operation from one of low to one of high level, the changes discussed above will start to become effective. As soon as a condition is reached where the number of electrons crossing the $N_0P_1$ junction tends to exceed the number crossing the $N_1P_0$ boundary and, conversely, the number of holes crossing $N_1P_0$ tends to exceed the number of holes crossing $N_0P_1$, then it must be expected that the positive biasing voltages across the two outer junctions $N_0P_1$ and $N_1P_0$ will increase. It should be noted that this will also have the effect of resulting in a voltage decrease across the $P_1N_1$ junction. The voltage drop across $P_1N_1$ will decrease because the $P_1$ section will become progressively less negative with respect to $N_1$ as a result of the increased accumulation of holes in $P_1$ and electrons in $N_1$. The increase in the biasing voltage across the outer junctions will have the effect of further increasing the current across the diode. Inasmuch as this additional increase in current will, in turn, raise the biasing voltages across the outer junctions still more and concurrently further decrease the reverse voltage across the middle junction $P_1N_1$, a situation is reached which is characteristic of a negative resistance. This means that, if the current across the diode is allowed to increase in a controllable fashion, the voltage across the diode, after the onset of breakdown, will decrease to a value determined by both the biasing voltages across $N_0P_1$ and $N_1P_0$ and the voltage (IR) drops across the various sections. On increasing the current across the diode beyond the negative-characteristic region, the voltage will increase slowly, mainly as a result of the increasing IR drops in the various sections.

While a specific embodiment of a switching diode has been described and an inchoate theory has been applied thereto, it should be realized that other combinations of junctions and other resistivity values may be used for the purposes of this invention. Thus, the volume resistivity of the material used may be as low as 0.05 ohm-centimeter and as high as 10 ohm-centimeters although material having a volume resistivity of approximately 0.1 ohm-centimeter is preferable. Similarly, in addition to germanium, silicon and aluminum antimonide, similar semiconductive materials may be used. While for the purposes of this invention it is essential that the width of the intermediate zones be substantially less, i.e., by a factor in excess of 5, than the diffusion length for minority carriers within the body of semiconductive material, this allows for a wide choice of zone width. Thus, intermediate-zone widths varying from 1 to 5 mils are considered as falling within the scope of this invention, although a zone width between 2 and 3 mils is preferred. Similarly, it has been found that the sharpness of the zone affects the characteristics of the negative-resistance region. In general, it is preferred that there be a complete transition from n-type to p-type within approximately a width of half a mil.

While I have described above the principles of my invention in connection with specific devices, it is to be clearly understood that this description is made only by way of example and not as a limitation to the scope of my invention as set forth in the objects thereof and in the accompanying claims.

I claim:

1. A switch comprising a substantially monocrystalline semiconductive body including four zones arranged in succession, contiguous zones being of opposite conductivity type characterized in that the voltage-current characteristic across said body as measured from the first to the fourth zones has a negative resistance region and a positive resistance region, and electrode connections to only the first and fourth zones of the succession with the intermediate two zones floating electrically therebetween.

2. A switching arrangement including a switch in accordance with claim 1 in further combination with switching control means including potential means for biasing in reverse the rectifying junction intermediate between the two intermediate zones of the succession, the value of said bias being such as to set the voltage current characteristic of said body in the positive resistance region, and means for applying to said switch pulses of the same polarity as said potential means and of an amplitude to trip said switch from said positive resistance region to its negative resistance region.

3. A switch comprising a substantially monocrystalline semiconductive body including four zones arranged in succession, contiguous zones being of opposite conductivity type characterized in that the voltage current characteristic across said body as measured from the first to the fourth zones has a positive resistance region and a negative resistance region and conductive leads connected only to the first and fourth zones of the succession, with the intermediate two zones being free of leads.

4. A switching arrangement including a substantially monocrystalline semiconductive body including four zones arranged in succession, contiguous zones being of opposite conductivity type, said body being characterized in that the voltage-current characteristic across said body as measured from the first to the fourth zones has a positive resistance region and a negative resistance region and conductive leads connected only to the first and fourth zones of the succession with the intermediate two zones being free of leads, means for applying a potential bias to said connections to bias in reverse the rectifying junction intermediate the two intermediate zones of the succession, the value of said bias being such as to set the voltage current characteristic of said body in a positive resistance region, means for raising the potential applied to said connections to trip said body from the positive resistance region to the negative resistance region of said voltage-current characteristic, and means controlling the current through said body to reset said characteristic of said body to its positive resistance region.

References Cited in the file of this patent

UNITED STATES PATENTS

| | | |
|---|---|---|
| 2,588,254 | Horovitz et al. | Mar. 4, 1952 |
| 2,735,948 | Sziklai | Feb. 21, 1956 |
| 2,756,285 | Shockley | July 24, 1956 |
| 2,811,653 | Moore | Oct. 29, 1957 |
| 2,838,617 | Tummers et al. | June 10, 1958 |